United States Patent [19]
Lee et al.

[11] Patent Number: 6,051,488
[45] Date of Patent: Apr. 18, 2000

[54] METHODS OF FORMING SEMICONDUCTOR SWITCHING DEVICES HAVING TRENCH-GATE ELECTRODES

[75] Inventors: Tea-Sun Lee; Sung-Kyu Song, both of Kyungki-do, Rep. of Korea

[73] Assignee: Fairchild Korea Semiconductor, Ltd., Seoul, Rep. of Korea

[21] Appl. No.: 09/007,878

[22] Filed: Jan. 14, 1998

[30] Foreign Application Priority Data

Jan. 14, 1997 [KR] Rep. of Korea .......................... 97-916

[51] Int. Cl.$^7$ .................................................. H01L 29/78
[52] U.S. Cl. ...................... 438/589; 438/270; 438/524; 438/548; 257/330
[58] Field of Search .................................. 438/259, 270, 438/368, 547, 548, 542, 589, 916; 257/513, 608, 330, 332, 212, 331

[56] References Cited

U.S. PATENT DOCUMENTS

| | | | |
|---|---|---|---|
| 4,380,866 | 4/1983 | Countryman et al. | 438/130 |
| 4,827,321 | 5/1989 | Baliga | 357/37 |
| 4,835,586 | 5/1989 | Cogan et al. | 357/23.14 |
| 5,017,998 | 5/1991 | Miura et al. | 257/330 |
| 5,021,846 | 6/1991 | Ueno | 357/23.4 |
| 5,023,196 | 6/1991 | Johnsen et al. | 437/40 |
| 5,032,888 | 7/1991 | Seki | 357/37 |
| 5,164,325 | 11/1992 | Cogan et al. | 437/29 |
| 5,168,331 | 12/1992 | Yilmaz | 257/331 |
| 5,202,750 | 4/1993 | Gough | 257/133 |
| 5,258,095 | 11/1993 | Nagata et al. | 438/257 |
| 5,304,821 | 4/1994 | Hagino | 257/133 |
| 5,357,125 | 10/1994 | Kumagi | 257/133 |
| 5,399,892 | 3/1995 | Neilson et al. | 257/341 |
| 5,424,231 | 6/1995 | Yang | 438/270 |
| 5,434,435 | 7/1995 | Baliga | 257/141 |
| 5,473,176 | 12/1995 | Kakumoto | 257/192 |
| 5,474,943 | 12/1995 | Hshieh et al. | 438/270 |
| 5,581,110 | 12/1996 | Razouk et al. | 257/513 |
| 5,629,543 | 5/1997 | Hshieh et al. | 257/330 |
| 5,665,619 | 9/1997 | Kwan et al. | 438/270 |
| 5,689,128 | 11/1997 | Hshieh et al. | 257/331 |
| 5,705,835 | 1/1998 | Nishiura et al. | 257/330 |
| 5,763,310 | 6/1998 | Gardner | 438/270 |
| 5,808,340 | 9/1998 | Wollesen et al. | 257/330 |
| 5,821,583 | 10/1998 | Hshieh et al. | 257/330 |

FOREIGN PATENT DOCUMENTS

| | | | |
|---|---|---|---|
| 000485018 | 5/1992 | European Pat. Off. | 257/300 |
| 36 1240675 | 10/1986 | Japan | 257/300 |

*Primary Examiner*—Robert P. Limanek
*Assistant Examiner*—Michael Dietrich
*Attorney, Agent, or Firm*—Myers Bigel Sibley & Sajoves; Grant J. Scott

[57] ABSTRACT

Methods of forming semiconductor switching devices having trench-gate electrodes include the steps of implanting base region dopants of second conductivity type into a semiconductor substrate to define a preliminary base region therein. A step is then performed to form a trench having sidewalls which extend through the preliminary base region. A sacrificial insulating layer is then formed on the sidewalls of the trench while the implanted base region dopants are simultaneously diffused into the region of first conductivity type. The sacrificial insulating layer is then removed. Next, a gate electrode insulating layer is formed on the sidewalls and on a bottom of the trench. A gate electrode is then formed on the gate electrode insulating layer. Dopants of first conductivity type are then implanted into the semiconductor substrate to define a preliminary source region, which forms a P-N junction with the implanted base region dopants, and into the gate electrode to improve the conductivity thereof. Then a thermal oxide layer is formed on the semiconductor substrate, while the implanted dopants of second and first conductivity type are diffused into the semiconductor substrate. A BPSG layer may also be deposited and reflowed. These latter steps may be utilized to accurately define the depth of the source region and the length of the channel regions extending along the sidewalls of the trenches. Preferred electrical characteristics can therefore be achieved through careful and essentially independent control of the depth/profile of the base region and the depth/profile of the source region.

16 Claims, 4 Drawing Sheets

METHODS OF FORMING SEMICONDUCTOR SWITCHING DEVICES HAVING TRENCH-GATE ELECTRODES

FIELD OF THE INVENTION

The present invention relates to methods of forming semiconductor switching devices, and more particularly to methods of forming semiconductor switching devices having trench-gate electrodes.

BACKGROUND OF THE INVENTION

A process for fabricating a MOS-based device by way of trench formation may be achieved in the manner as illustrated in FIGS. 1–3. As shown in FIG. 1, a thin oxide layer 30 is formed on a lightly doped N-type epitaxial layer 20. P-type impurities are then implanted into the epitaxial layer 20 at respective dose and implant energy levels to form a blanket implant region 40b and selective higher doped implant regions 40a.

As shown in FIG. 2, implanted dopants in regions 40b and 40a are then diffused to form a P-type body region 40. N-type impurities are then implanted into the P-type body region 40, followed by diffusion, to obtain heavily doped N-type source regions 50.

As shown in FIG. 3, trenches 100 are formed by a RIE (Reactive Ion Etching) step and a sacrificial oxide layer is formed to remove damage generated by the RIE. Following the sacrificial oxide layer removal, polysilicon gate electrodes 70 are formed via the steps of gate.

Such a prior art process may be problematic in that the step of forming the sacrificial oxide layer should be performed at high temperature in order to remove the damaged layer caused by the RIE and round the top and bottom edges of the trench. In this respect, the doping profiles of the P-type body region 40 and N-type source regions 50 are modified by the high temperature thermal treatment. A short channel as well as an unwanted gate threshold voltage may result since the heavily doped N-type impurities are diffused and the concentration of P-type dopants decreases in the channel region. Leakage currents may also increase between drain and source regions. In addition, for MOS devices, an appropriate insulating voltage may be hard to attain because the gate oxide layer 60 has a thickness in the 400 to 500 Å range and the concentration of P-type dopants is low in the channel region. Thus, notwithstanding this conventional method of forming MOS-based switching devices having trench gates, there continues to be a need for improved methods which limit the above-described problems.

SUMMARY OF THE INVENTION

It is therefore an object of the present invention to provide improved methods of forming semiconductor switching devices.

It is another object of the present invention to provide methods of forming semiconductor switching devices having improved electrical characteristics.

These and other objects, advantages and features of the present invention are provided by methods of forming semiconductor switching devices which include the steps of forming a first insulating layer on a face of a semiconductor substrate containing a region of first conductivity type therein extending to the face. Base region dopants of second conductivity type are then implanted through the first insulating layer and into the region of first conductivity type to define a preliminary base region therein extending to the face. A step is then performed to form a trench having sidewalls which extend through the preliminary base region and into the region of first conductivity type, at the face of the semiconductor substrate. According to a preferred aspect of the present invention, a sacrificial insulating layer is then formed on the sidewalls of the trench while the implanted dopants of second conductivity type are simultaneously diffused into the region of first conductivity type. The sacrificial insulating layer and first insulating layer are then removed. Next, a gate electrode insulating layer is formed on the sidewalls and on a bottom of the trench. A gate electrode is then formed on the gate electrode insulating layer. Dopants of first conductivity type are then implanted into the semiconductor substrate to define a preliminary source region, which forms a P-N junction with the implanted dopants of second conductivity type. At the same time, dopants of first conductivity type are also implanted into the gate electrode to increase the conductivity thereof.

According to a preferred embodiment of the present invention, a step is also performed to form a thermal oxide layer on the semiconductor substrate, while simultaneously diffusing the implanted dopants of second and first conductivity type into the semiconductor substrate to define a base region of second conductivity type and a source region of first conductivity type in the base region. According to this embodiment, the step of forming the trench preferably comprises anisotropically etching the semiconductor substrate to define a preliminary trench and then wet etching the preliminary trench. Here, the step of forming the trench may comprise anisotropically etching the semiconductor substrate using a reactive ion etchant to define a preliminary trench and then wet etching the preliminary trench using an aqueous solution containing a material selected from the group consisting of fluoric acid, nitric acid and acetic acid. Moreover, the step of implanting dopants of second conductivity type may include the step of performing a blanket implant of second conductivity type dopants at a first dose level through the first insulating layer and then performing a selective implant of second conductivity type dopants at a second dose level, greater than the first dose level, through the first insulating layer. Thus, according to the present invention, the formation of a source region by implantation and diffusion is delayed until after the sacrificial insulating layer and gate insulating layer have been formed so that excessive diffusion of the source region dopants can be prevented.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types. Like numbers refer to like elements throughout.

Figure 1:
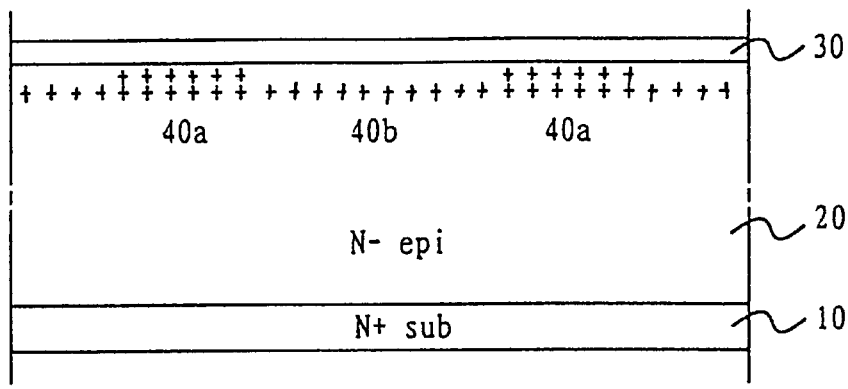
FIGS. 1–3 are cross-sectional views of intermediate structures that illustrate a method of forming a trench-gate MOSFET according to the prior art.
Figure 2:
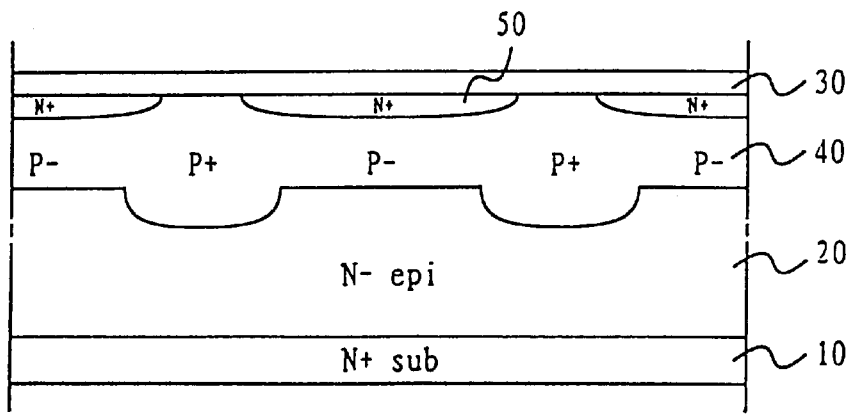
Figure 3:
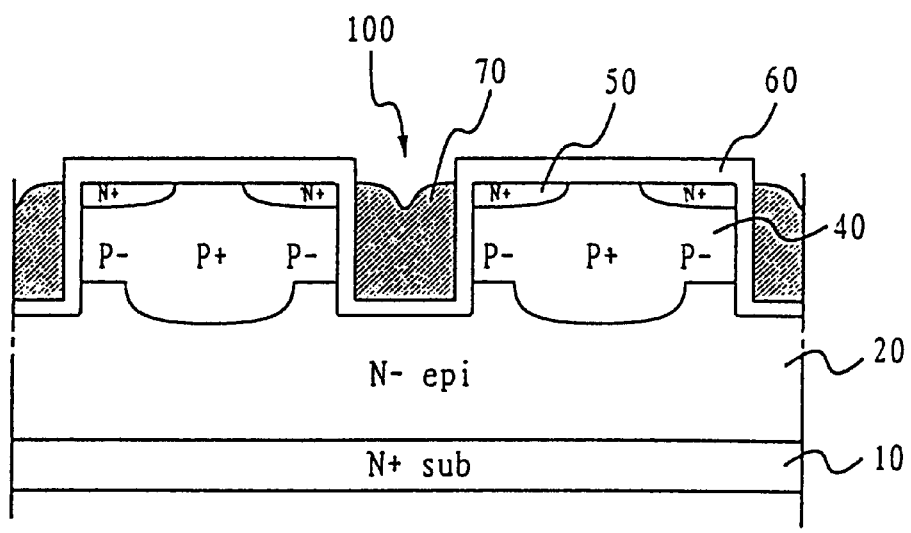
Figure 4:
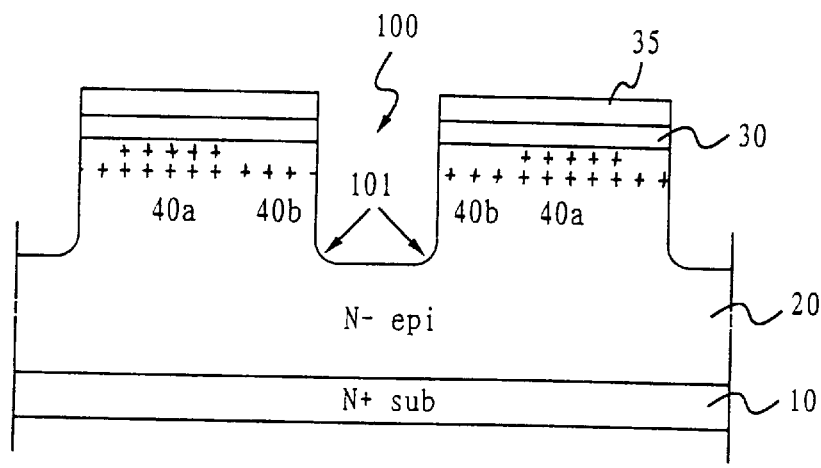
FIGS. 4–6 are cross-sectional views of intermediate structures that illustrate a method of forming a semiconductor switching device according to a first embodiment of the present invention.

Referring now to FIG. 4, a preferred method of forming a semiconductor switching device having a trench-gate includes the step of forming a thin oxide layer 30 on a face of a semiconductor substrate containing a relatively lightly doped epitaxial layer 20 of first conductivity type (shown as N−) on a more highly doped substrate layer 10 of first conductivity type (shown as N+). Implant regions 40a and 40b are then formed by implanting dopants of second conductivity type (e.g., P-type) through the thin oxide layer 30 and into the epitaxial layer 20. In particular, a blanket implant step may be performed at a first energy level and a first dose level to form region 40b and then a selective implant step may be performed at a second energy level and a second dose level to form regions 40a. Here, the selective implant step may be performed using an implant mask (not shown) and the second dose level may be greater than the first dose level. As described more fully hereinbelow, these implanted dopants are then driven-in (e.g., diffused) to form a base region 40 of second conductivity type (e.g., P-type) having more highly doped contact regions (shown as P+) and more lightly doped channel regions (shown as P−).

Referring still to FIG. 4, an etching mask 35 (e.g., silicon dioxide, photoresist) is then formed on the thin oxide layer using conventional techniques (e.g., deposition and photolithographic patterning). An anisotropic etching step is then preferably performed to define a plurality of preliminary trenches which extend into the epitaxial layer. Here, each preliminary trench is preferably formed to extend through implant region 40b, and between the adjacent implant regions 40a which are more highly doped. The preliminary trenches may be formed as a plurality of parallel stripe-shaped trenches, however, other shapes may be defined. The anisotropic etching step is preferably performed using a reactive ion etchant (RIE) as a dry etchant. According to a preferred aspect of the present invention, a wet etching step is then performed to etch the sidewalls and bottom of the preliminary trenches and define final trenches 100. The wet etching step may be performed using an aqueous solution of fluoric acid and nitric acid or a mixed acetic acid solution. The wet etching step may be performed to etch about 1000 521 from the bottom corners 101 of the trenches. These rounded corners of the trench improve the integrity and uniformity of the subsequently formed gate insulating layer and improve the breakdown characteristics of the preferred switching devices by, among other things, reducing the critical electric field strength at the corners of the trenches during device operation.

Figure 5:
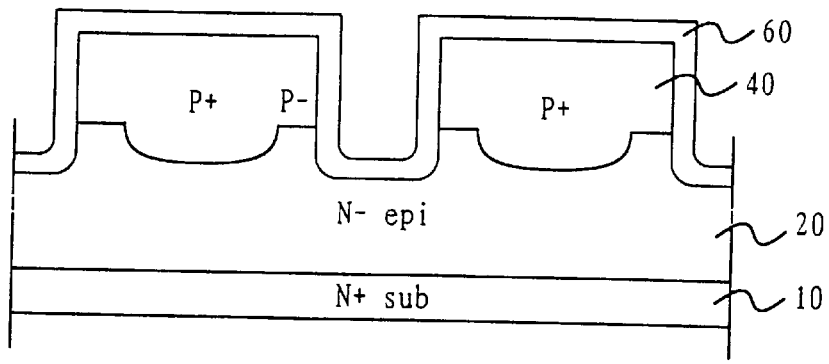

Referring now to FIG. 5, a sacrificial oxide layer is then grown on the bottoms and sidewalls of the trenches 100, to a thickness of about 3000 Å. This sacrificial oxide layer may be formed at a high temperature of about 1100° C. As will be understood by those skilled in the art, the sacrificial oxide layer can be formed to remove etching defects from the sidewalls and bottoms of the trenches 100. During the step of forming the sacrificial oxide layer at high temperature, the previously implanted dopants of second conductivity type are driven into the substrate. The sacrificial oxide layer, thin oxide layer 30 and etching mask 35 may then be removed to expose the face of the semiconductor substrate, using a fluoric acid solution, for example. A gate oxide layer 60 may then be formed at a high temperature to a thickness of about 400 to 500 Å. Here, the high temperature formation of the gate oxide layer is preferred to achieve uniform oxide thickness of high quality. During this step, the dopants of second conductivity type are again driven into the substrate to define a base region 40, as illustrated. Here, the steps of forming the sacrificial oxide layer and gate oxide layer 60 can be carefully controlled to drive in the dopants of second conductivity type and obtain preferred doping profiles therein so that the switching device can have low on-state resistance, low base contact resistance, uniform channel region characteristics (e.g., threshold voltage), high blocking voltage capability, etc. The gate oxide layer 60 can then be selectively patterned using conventional techniques to expose the face of the substrate.

Figure 6:
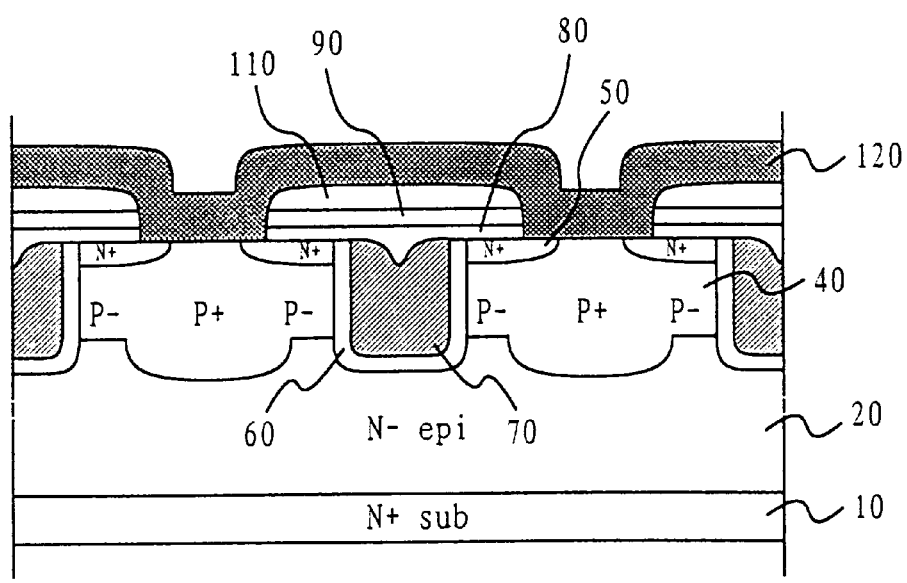

Referring now to FIG. 6, polycrystalline silicon gate electrodes 70 are then formed in the trenches 100. The gate electrodes 70 may be formed by conformally depositing a layer of polycrystalline silicon on the gate oxide layer 60 and substrate and then etching back (e.g., planarizing) the deposited layer of polycrystalline silicon to define separate gate electrodes 70 and expose the face of the substrate. An implant mask (not shown) can then be formed on the exposed face of the substrate. Dopants of first conductivity type (e.g., N-type) are then preferably simultaneously implanted at a high dose level into the gate electrodes 70 and into portions of the base region 40 extending adjacent sidewalls of the trenches to define preliminary source regions of first conductivity type in the base region 40. Because these preliminary source regions are formed after the sacrificial oxide layer and gate oxide layer have been formed, unwanted diffusion of the source region dopants, which can lead to the formation of excessively short channel devices, can be prevented. The implant mask is then removed to expose the substrate. First and second oxide layers 80 and 90 may then be formed as a composite oxide layer on the gate electrodes 70 and exposed portions of the substrate. Here, the first oxide layer 80 may be a thermally formed silicon dioxide layer. A layer 110 of borophosphosilicate glass (BPSG) may then be formed on the oxide layers 80 and 90. The layer 110 of BPSG is then preferably reflowed using conventional techniques. During this reflowing step and the prior step of forming the first oxide layer 80, dopants in the preliminary source regions may be driven into the base region 40 in a controlled manner to define a plurality of source regions 50, as illustrated. Accordingly, careful control of the steps of forming the first oxide layer 80 and reflowing the BPSG layer 110 may be used to accurately define the depth of the source regions 50 and the length of the channel regions extending vertically along the sidewalls of the trenches, between the bottom edges of the source regions 50 and the epitaxial region 20. Preferred electrical characteristics can therefore be achieved through careful and essentially independent control of the depth/profile of the base region 40 and the depth/profile of the source regions 50 therein.

Contact holes may then be formed to expose the highly doped portions of the base region 40 (e.g., contact portions) at adjacent locations, expose the source regions 50 and expose the gate electrodes 70. Conventional metallization techniques may then be performed to define a base contact layer 120, source contacts (not shown) and gate electrode contacts (not shown).

In the drawings and specification, there have been disclosed typical preferred embodiments of the invention and, although specific terms are employed, they are used in a generic and descriptive sense only and not for purposes of That which is claimed is:

1. A method of forming a semiconductor switching device, comprising the steps of:
   forming a base region in a semiconductor substrate by implanting base region dopants of second conductivity type into the semiconductor substrate;
   forming a trench in the semiconductor substrate;
   forming a gate electrode which extends opposite the base region, in the trench; then
   implanting dopants of first conductivity type into the gate electrode and the base region simultaneously; and
   forming a thermal oxide layer on the semiconductor substrate, while simultaneously diffusing the implanted dopants of first conductivity type into the base region to define a source region therein.

2. The method of claim 1, wherein the semiconductor substrate contains a drift region of first conductivity type therein extending to a face thereof.

3. The method of claim 2, wherein said gate electrode forming step is preceded by the step of forming a sacrificial oxide layer on sidewalls of the trench while simultaneously diffusing the base region dopants of second conductivity type into the drift region of first conductivity type.

4. The method of claim 2, wherein said trench forming step comprises anisotropically etching the semiconductor substrate to define a preliminary trench and then wet etching sidewalls and a bottom of the preliminary trench.

5. The method of claim 4, wherein said step of anisotropically etching the semiconductor substrate comprises etching the semiconductor substrate using a reactive ion etchant.

6. The method of claim 5, wherein said step of wet etching the sidewalls and bottom of the preliminary trench comprises wet etching the sidewalls and bottom of the preliminary trench using an aqueous solution containing a material selected from the group consisting of fluoric acid, nitric acid and acetic acid.

7. The method of claim 3, wherein said step of forming a sacrificial oxide layer on sidewalls of trench is followed by the step of removing the sacrificial oxide layer using fluoric acid.

8. The method of claim 3, wherein said step of forming a base region by implanting base region dopants comprises implanting dopants of second conductivity type at a first dose level into the face of the semiconductor substrate and implanting dopants of second conductivity type at a second dose level greater than the first dose level.

9. The method of claim 8, wherein said step of forming a gate electrode includes the step of forming a gate electrode insulating layer on sidewalls and a bottom of the trench.

10. A method of forming a semiconductor switching device, comprising the steps of:
    forming a first insulating layer on a face of a semiconductor substrate containing a region of first conductivity type therein extending to the face;
    implanting dopants of second conductivity type through the first insulating layer and into the region of first conductivity type to define a preliminary base region therein extending to the face;
    forming a trench having sidewalls which extend through the preliminary base region and into the region of first conductivity type, at the face of the semiconductor substrate;
    forming a sacrificial insulating layer on the sidewalls of the trench while simultaneously diffusing the implanted dopants of second conductivity type into the region of first conductivity type;
    removing the sacrificial insulating layer and first insulating layer; then
    forming a gate electrode insulating layer on the sidewalls and a bottom of the trench;
    forming a gate electrode on the gate electrode insulating layer;
    implanting dopants of first conductivity type into the semiconductor substrate to define a preliminary source region, which forms a P-N junction with the implanted dopants of second conductivity type, while simultaneously implanting dopants of first conductivity type into the gate electrode; and
    forming a thermal oxide layer on the semiconductor substrate while simultaneously diffusing the implanted dopants of second and first conductivity type into the semiconductor substrate to define a base region of second conductivity type and a source region of first conductivity type in the base region.

11. The method of claim 10, wherein said step of forming a trench comprises anisotropically etching the semiconductor substrate to define a preliminary trench and then wet etching the preliminary trench.

12. The method of claim 10, wherein said step of forming a trench comprises anisotropically etching the semiconductor substrate using a reactive ion etchant to define a preliminary trench and then wet etching the preliminary trench using an aqueous solution containing a material selected from the group consisting of fluoric acid, nitric acid and acetic acid.

13. The method of claim 12, wherein said removing step comprises etching the sacrificial insulating layer using fluoric acid.

14. The method of claim 11, further comprising the step of forming a layer of borophosphosilicate glass on the thermal oxide layer and then reflowing the layer of borophosphosilicate glass.

15. The method of claim 12, wherein said step of implanting dopants of second conductivity type includes the steps of performing a blanket implant of second conductivity type dopants at a first dose level through the first insulating layer and then performing a selective implant of second conductivity type dopants at a second dose level, greater than the first dose level, through the first insulating layer.

16. The method of claim 12, wherein said wet etching step comprises etching about 1000 Å from a sidewall of the preliminary trench.

* * * * *